United States Patent
Smeets et al.

(10) Patent No.: US 7,212,679 B2
(45) Date of Patent: May 1, 2007

(54) FONT COMPRESSION AND RETRIEVAL

(75) Inventors: Bernard Jan M. Smeets, Dalby (SE); Jan Aberg, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 73 days.

(21) Appl. No.: 10/913,639

(22) Filed: Aug. 6, 2004

(65) Prior Publication Data

US 2005/0047669 A1   Mar. 3, 2005

Related U.S. Application Data

(62) Division of application No. 09/794,706, filed on Feb. 27, 2001, now abandoned.

(51) Int. Cl.
G06K 9/36 (2006.01)
G06K 9/54 (2006.01)
G06K 1/00 (2006.01)
G06T 11/00 (2006.01)

(52) U.S. Cl. ............ 382/244; 382/305; 358/1.11; 345/467

(58) Field of Classification Search ......... 382/238, 382/246, 247, 244, 245, 305; 715/535; 345/467; 358/1.11
See application file for complete search history.

(56) References Cited

U.S. PATENT DOCUMENTS

| | | | |
|---|---|---|---|
| 3,701,111 A | 10/1972 | Cocke et al. | |
| 4,559,615 A | 12/1985 | Goo et al. | |
| 4,799,242 A | 1/1989 | Vermeulen | |
| 5,020,121 A | 5/1991 | Rosenberg | |
| 5,045,852 A | 9/1991 | Mitchell et al. | |
| 5,058,187 A | 10/1991 | Kim | |
| 5,473,704 A | 12/1995 | Abe | |
| 5,488,365 A | 1/1996 | Seroussi et al. | |
| 5,528,628 A | 6/1996 | Park et al. | |
| 5,587,725 A | 12/1996 | Sakanishi et al. | |
| 5,915,041 A * | 6/1999 | Thielens | 382/232 |
| 6,236,342 B1 * | 5/2001 | Symes | 341/67 |
| 6,433,709 B1 * | 8/2002 | Oue | 341/67 |

FOREIGN PATENT DOCUMENTS

EP   0 687 995   12/1995

(Continued)

OTHER PUBLICATIONS

Alexandra Duel-Hallen, Delayed Decision-Feedback Sequence Estimation; IEEE Transactions on Communications; vol. 37, No. 5; May 1989; 9 Pages.

(Continued)

Primary Examiner—Colin LaRose
(74) Attorney, Agent, or Firm—Michael Cameron, Esq.

(57) ABSTRACT

Method and apparatus for compressing data representing a set of symbols such that each symbol of the set can be separately accessed and decompressed. Each symbol of the set of symbols is encoded in the form of a two-part code wherein a first part of the code is common for all encoded symbols and a second part of the code encodes the data representing a symbol. An identifier is given for each symbol for permitting each encoded symbol to be separately accessed and decompressed. The invention is particularly useful for storing large fonts such as a Chinese or Japanese character set.

5 Claims, 4 Drawing Sheets

FOREIGN PATENT DOCUMENTS

| | | |
|---|---|---|
| EP | 0 745 946 | 12/1996 |
| EP | 0 813 167 | 12/1997 |
| EP | 0 932 883 | 3/2002 |
| JP | 63263561 | 10/1988 |
| JP | 6195063 | 7/1994 |
| JP | 6266531 | 9/1994 |
| JP | 7199894 | 8/1995 |
| JP | 11055125 | 2/1999 |
| WO | WO 98/16902 | 4/1998 |
| WO | WO 99/21075 | 4/1999 |

OTHER PUBLICATIONS

C.B. Jones; An Efficient Coding System for Long Source Sequences; IEEE Transactions on Information Theory, vol. 27, No. 3; May 1981; 11 Pages.

D.A. Huffman; A Method for the Construction of Minimum-Redundancy Codes; Proc. IRE; vol. 40, (1952); 3 Pages.

Mu-King Tsay et al.; Data Compression on Multifont Chinese Character Patterns; Mar. 1994; No. 2; 8 Pages.

Makoto Nagao; Data Compression of Chinese Character Patterns; XP00601742; Jul. 1980; vol. 68, No. 7; 12 Pages.

Kuang-Yao Chang et al.; CCIGS: A Data Compression System for Chinese Fonts and Binary Images Using Classification Techniques; XP000655815; Dec. 1992; vol. 22; 21 Pages.

Phil Vines et al.; Compression Techniques for Chinese Text; XP00778145; Oct. 1998; vol. 28; 16 Pages.

Ong et al.; A Semi-Adaptive Arithmetic Coding Scheme for Chinese Textual Data; Proceedings of the IEEE; vol. 2, 5 Pages.

Liu, et al.; Image Coding for Chinese Character Patterns; Proceedings of the SPIE; vol. 845, 1987; 6 Pages.

R.H. Ju, et al.; Global Study on Data Compression Techniques for Digital Chinese Character Patterns; Jan. 1992; No. 1, Part E.; 8 Pages.

Ong et al.; A Data Compression Scheme for Chinese Text Files Using Huffman Coding and a Two-Level Dictionary; Information Sciences; vol. 84, No. 1-2, 15 pages.

\* cited by examiner

FONT COMPRESSION AND RETRIEVAL

This patent application is a divisional of U.S. patent application Ser. No. 09/794,706, filed on Feb. 27, 2001 now abandoned.

BACKGROUND OF THE INVENTION

1. Field of the Invention

The present invention relates generally to the compression and retrieval of data representing a font or other set of symbols; and, more particularly, to a method and apparatus for storing a large font, such as a Chinese or Japanese character set, in a compressed form while retaining access to individual symbols of the font.

2. Description of the Prior Art

In order to display messages in languages such as Chinese or Japanese on a CRT or an LCD display, a large set of symbols, or glyphs, is required. For example, the Chinese Unicode standard character set contains about 21,000 different Chinese symbols. Furthermore, each symbol is the size of at least some hundreds of pixels; and, as a result, to store a complete Chinese font requires a large amount of memory. Being able to store the glyphs in a more compact format than pure bitmaps will substantially reduce memory requirements.

For laser printers or high resolution displays, a font is usually stored as a series of points that are joined by curves. This brings the additional advantage of making font scaling possible, although for fonts stored in this way, some processing is needed to render the image itself. For lower resolution displays, font scaling is not of interest, and it would be more efficient to store the font as a bitmap.

The majority of lossless data compression methods known in the art work in a sequential manner by referring back to data that has already been encoded. Such methods are inappropriate for font compression, however; where, ideally, only a single glyph should be decompressed at a time. If sequential methods of this type are employed, some blocking of the glyphs is required, and a trade-off must be made between the two extremes of compressing the entire font as one block, thus losing random access capability, and compressing each symbol separately, in which case overall performance becomes quite poor.

Instead of the above-mentioned sequential codes, a two-part code can also be used to compress and retrieve a font. Typically, the first part of such a code describes the statistical properties, or a model, of the data; and the second part encodes the data by a code derived from the model.

Exemplary of font compression and retrieval methods known in the prior art include those described in U.S. Pat. Nos. 5,488,365; 5,058,187; 5,587,725; 5;473;704; and 5,020,121; and PCT Publication No. WO 98/16902. In general, however, none of these prior art methods describes a font compression and retrieval technique that provides complete random access of individual symbols of the font, which is important to permit high-speed access of the symbols by modern high-speed equipment.

SUMMARY OF THE INVENTION

The present invention is directed to a method and apparatus for the compression and retrieval of data representing a set of symbols; and, particularly, to a method and apparatus for compressing a font which comprises a large number of glyphs, such as a Chinese or a Japanese character set, in such a manner that each individual glyph of the character set can be separately accessed and decompressed.

A method for compressing data representing a set of symbols according to the present invention includes encoding each symbol of the set of symbols in the form of a two-part code wherein a first part of the two-part code is common for all encoded symbols of the set and a second part of the two-part code comprises encoded data representing a symbol of the set, wherein each encoded symbol of the set can be separately accessed and decompressed.

The present invention provides a data compression method that is based on the use of a two-part code, however, the first part of the code is common for all symbols of the set of symbols, and this allows each encoded symbol to be separately accessed and decompressed. The present invention, accordingly, provides the property of random access to the individual symbols of the set which, as indicated above, is a particularly important capability in modern high-speed equipment.

According to a presently preferred embodiment of the invention, the set of symbols comprises a font of individual symbols or glyphs, and the data representing the glyphs includes a bitmap for each glyph. To encode a font, a statistical model of the set of glyphs is created (the first part of the two-part code or the "model"), and each glyph is then separately compressed with a code derived from the model (the second part of the two-part code or the "codeword"). The compressed glyphs are partitioned by codeword length, and one indexing table, sorted by an identifier for each glyph, is created for each partition. An encoded font will thus comprise a statistical model, a set of code words, a set of indexing tables, a table of lengths for the indexing tables and, perhaps, auxiliary tables used for decoding.

To decode a particular glyph, given the identifier for the glyph, the indexing tables are first searched for a matching entry. From the table lengths and the position in the table, the position or location of the particular glyph in the code set can be computed, and this permits the desired codeword for that glyph to then be extracted and decoded. Because, in the present invention, a two-part code is used where the first part of the code is common for all the encoded glyphs; indexing is greatly simplified inasmuch as for each glyph it is only necessary to locate the codeword for that particular glyph.

In accordance with one presently preferred embodiment of the invention, font compression is achieved utilizing an arithmetic encoder with a fixed probability table. This procedure provides near optimal compression of the glyphs, given the probability table, without the need of additional tables. According to an alternative embodiment of the invention, font compression is by means of a predictive encoding scheme with a fixed prediction table followed by a fixed Huffman coding. This procedure makes it possible to have a very fast decompression while retaining reasonable compression speeds. This embodiment is also particularly suitable for hardware implementation.

In general, with the present invention, complete random access to individual symbols of a set of symbols is gained at the cost only of using a two-part code with separate code words instead of an adaptive one-part code as is known in the prior art. The additional cost in memory requirements is estimated to be no more than about 10 to 15 percent for a font of 10,000 symbols.

Yet further advantages and specific features of the invention will become apparent hereinafter in conjunction with the following detailed description of presently preferred embodiments thereof.

DETAILED DESCRIPTION OF PRESENTLY PREFERRED EMBODIMENTS

Figures 1, 2:
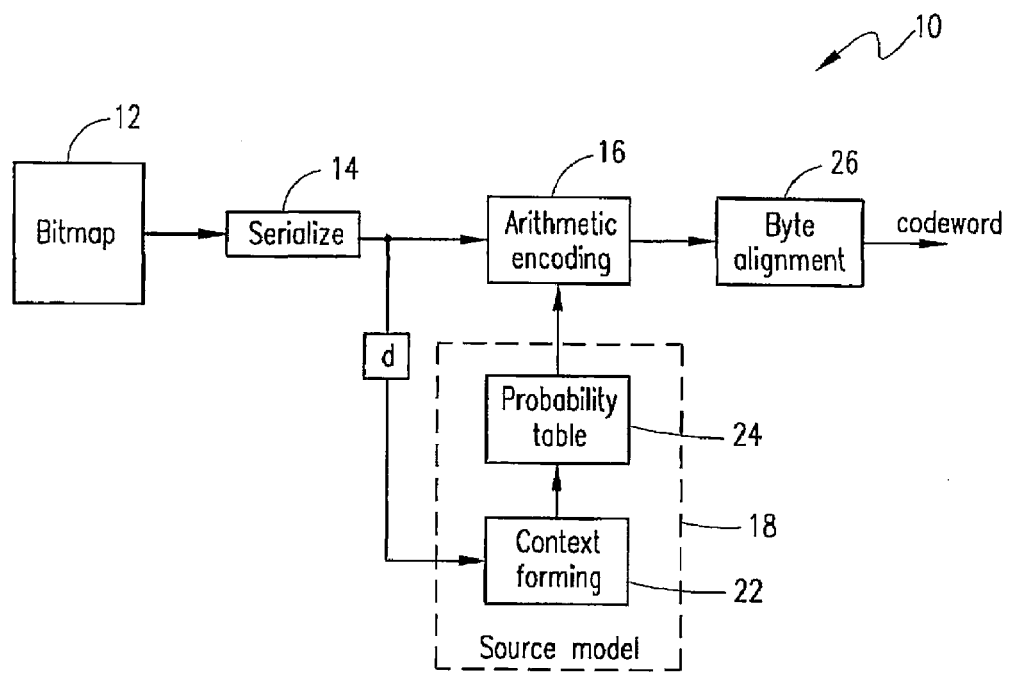
FIG. 1 schematically illustrates an encoder for a font compression scheme according to a first presently preferred embodiment of the invention.
FIG. 2 schematically illustrates one example of a conditioning context of a pixel to assist in explaining the operation of the encoder of FIG. 1.

FIG. 1 is a block diagram schematically illustrating the encoder structure of a compression scheme according to a first embodiment of the present invention for compressing data representing a set of symbols such as a font of Chinese or Japanese symbols or glyphs. Initially, it should be appreciated that the encoding procedures described can be carried out without time limitations so as to permit optimization of the size of the compressed data.

The encoder of FIG. 1 is generally designated by reference number 10 and is composed of a plurality of modules. Initially, a two-dimensional bitmap 12 representing a symbol or glyph of a font, is converted to a sequence $x^n = x_1, x_2, \ldots, x_n$ of bits by a serialize module 14 by scanning the bitmap according to some specified rule. Possible scan orders, for example, include row-wise, column-wise, diagonal or a more involved scan order as are well-known to those skilled in the art.

The sequence of bits output from the serialize module 14 is directed to an arithmetic encoder module 16 which may be a standard binary arithmetic encoding unit (see, for example, C. B. Jones, "An Efficient Coding System for Long Source Sequences", *IEEE Transactions on Information Theory*, vol. 27, no. 3, pp. 280–291, May, 1981). For efficiency, the arithmetic precision of the encoder should be matched with the precision of the probability table that will be discussed hereinafter. The bits are encoded sequentially as the bitmap is scanned.

The model that provides the coding probabilities for the arithmetic coding is illustrated by dashed block 18 and is designated in FIG. 1 as a source model. The source model is context based, i.e., the probability distribution of each pixel of the bitmap is determined by a conditioning context of surrounding pixel values. Thus, the model includes a context forming unit or module 22 which selects bits from previously encoded ones in the same bitmap to determine the context, which is represented as an integer. FIG. 2 schematically illustrates one example of the correspondence between context pixels and bit positions. The conditioning context of any pixel must contain only pixels that appear earlier in the scan order. Its shape may vary depending on the pixel. Any context pixel outside the bitmap is set to zero.

The source model 18 also includes a probability table 24 which has one entry per possible context, containing the pixel probability conditioned on that context, stored with fixed precision.

Given the size and shape of the context, the probability table 24 is constructed by counting the occurrences of ones in each context, and normalizing by the number of occurrences of the context.

If only certain codeword lengths are allowed, for instance integer bytes, zeros are appended to the end of the output of the arithmetic encoder by byte alignment module 26. The output of the byte alignment module is the codeword representing a symbol or glyph of the font.

Each glyph of the font is encoded utilizing the encoder of FIG. 1 until the entire font has been encoded and stored in memory. Before a font is encoded, the scan order and the context forming function are chosen. Different sizes of contexts, scan orders, context forming functions, and precisions of the probability table can be tried in order to find the one yielding the best compression. The quantity that is minimized here to yield the best compression is the size of the codeword set-plus the size of the probability table.

The code words produced by the above procedure are sorted first by length and then by identifier, which is given for each glyph of the font, and an index table for each length is constructed as a list of identifiers sorted in ascending order. For each index table is stored in a length table the codeword length it corresponds to, and the table length.

The code words are stored together with the index table and the length table. It should be noted that the information about the location and length of each codeword in memory is present only in the index and length tables, i.e., the code words are stored sorted by length and identifier but without any separators.

When a glyph with given identifier I is to be decoded, the index tables are first searched one by one, using a binary search. If the identifier is found, the address of the corresponding codeword is found by summing the product of the codeword length and the number of code words of that length over all codeword lengths smaller than the one of the searched table (counting of the code words should begin at zero), and adding the codeword length of the searched table times the position of the identifier in the table. Other search orders of the tables are also possible. For instance, one could search the tables in order of descending size, if desired; and it is not intended to limit the invention to any particular search order. It should also be understood that other searching methods can be used as well without departing from the scope of the present invention, and it is also not intended to limit the invention to any particular searching method.

Figure 3:
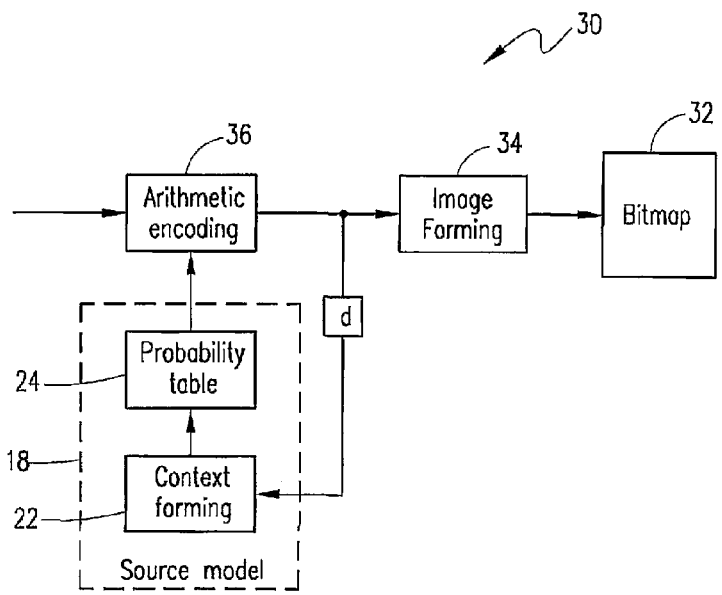
FIG. 3 schematically illustrates a decoder for retrieving data encoded by the encoder of FIG. 1.

Once the codeword has been located in memory, it is decoded by the decoding structure 30 illustrated in FIG. 3. In FIG. 3, the source model 18 is identical to the source model 18 in the encoder 10 of FIG. 1 (and thus has been given the same reference number), the arithmetic decoder 36 parallels the arithmetic encoder 16 in the usual way, and the image former 34 is simply the inverse of the serializer 14 in the encoder of FIG. 1. The decoder 30 in FIG. 3 provides as the output thereof the bitmap 32 of the desired glyph from the compressed font.

Figure 4:
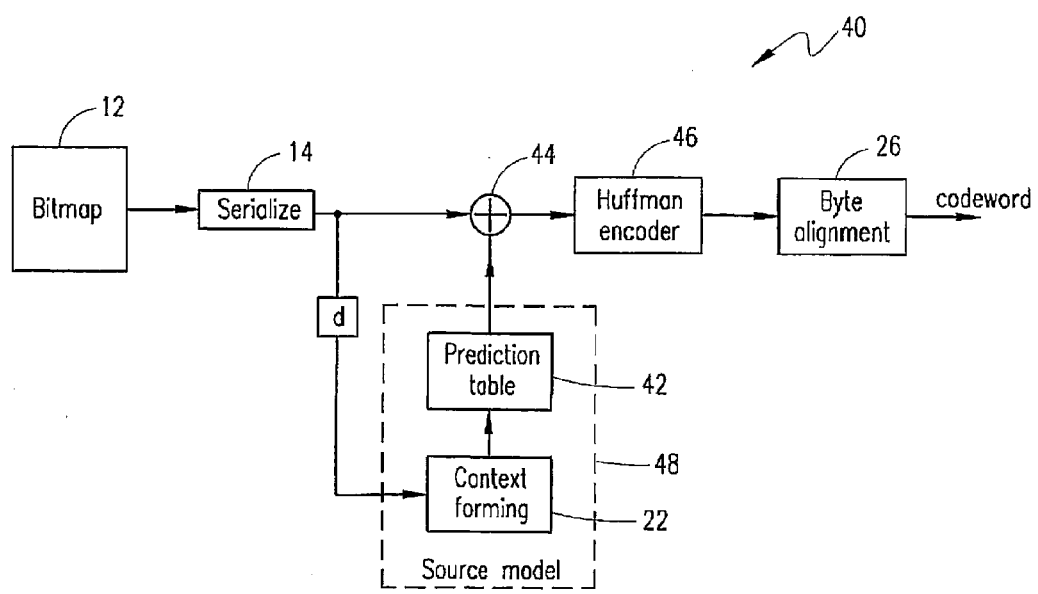
FIG. 4 schematically illustrates an encoder for a font compression scheme according to a second presently preferred embodiment of the invention.

FIG. 4 is a block diagram schematically illustrating the structure of an encoder 40 according to a second embodiment of the present invention. In FIG. 4, the probability table of the source model 18 of the encoder 10 of FIG. 1 is replaced by a prediction table 42 in a source model 48 in which each entry is one bit, indicating the most probable bit value in each context. The predicted value for each bit is exclusive-ORed with the actual bit by unit 44, producing a bit stream that is encoded by a Huffman code in Huffman encoder module 46 (see D. A. Huffman, "A Method for the Construction of Minimum-Redundancy Codes", *Proc. IRE,* vol. 40, pp 1098–1101, 1952.)

In this embodiment, in addition to the code words, the index table and the length table, a description of the Huffman code must also be made available to the decoder. The optimization with respect to context size, etc. as described above with respect to the first embodiment, can be applied to this embodiment as well. The decoder structure for use with the encoder of this embodiment is also analogous to the decoder used with the encoder of the first embodiment (illustrated in FIG. 3), and need not be further described herein.

Figure 5:
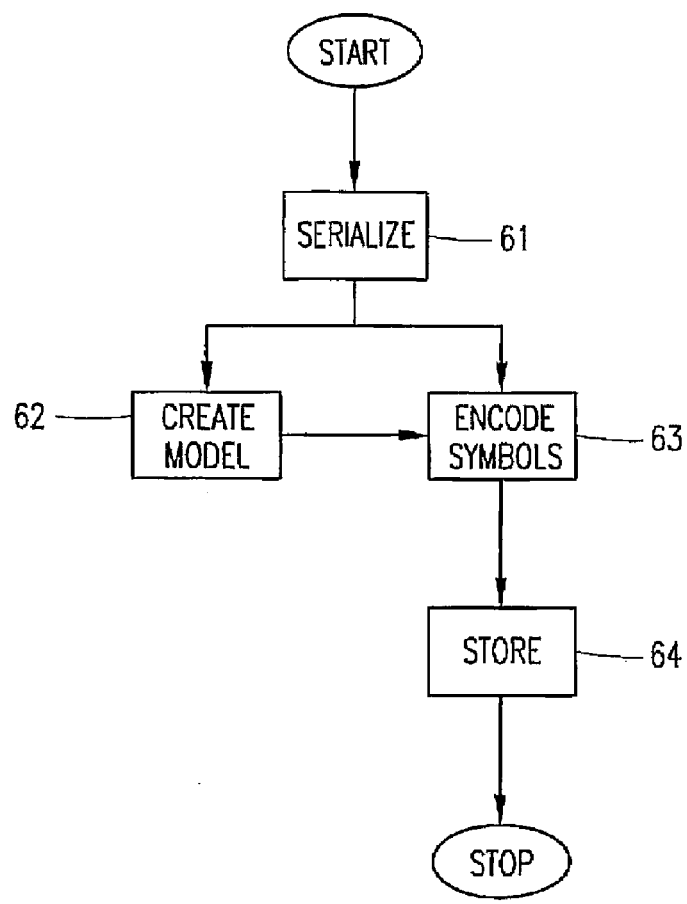
FIGS. 5 and 6 are flow charts illustrating the basic steps of the encoding and decoding procedures, respectively, for a font compression and retrieval method according to the present invention.
Figure 6:
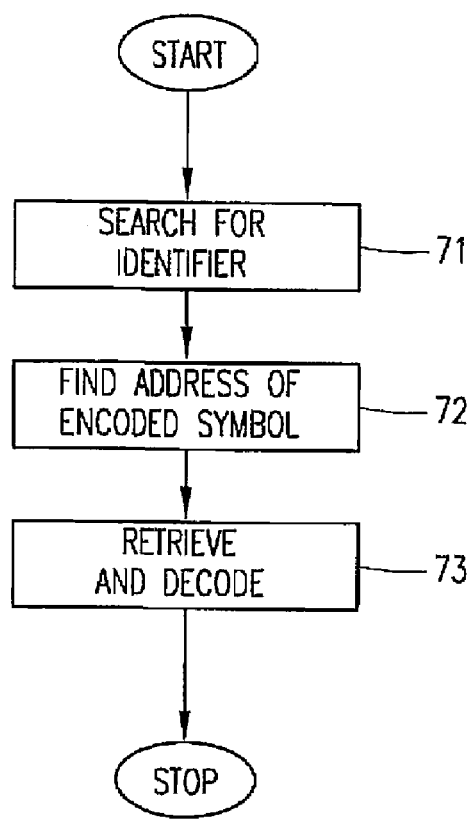

FIGS. 5 and 6 are flowcharts which generally illustrate the steps of the encoding and decoding procedures, respectively, of the compression and retrieval methods of the present invention. Initially, with respect to FIG. 5, to encode a font, two-dimensional bitmaps of the individual symbols or glyphs of the font are serialized at step 61 using the serializer 14 shown in FIGS. 1 or 4. A source or statistical model of the serialized data is created at step 62 using the context forming module 22 and either the probability table 24 of FIG. 1 or the prediction table of FIG. 4. The sequence of bits output from the serializer is then encoded in step 63 where each symbol or glyph of the font is independently encoded with a code derived from the statistical model by either the arithmetic encoder 16 of FIG. 1 or the Huffman encoder 46 of FIG. 4 to provide the encoded codeword set representing the font. The encoded font is then stored in memory at step 64 for later retrieval, for example. As indicated above, the code words are stored together with the index table and the length table.

To decode the encoded symbols stored in memory; as illustrated in FIG. 6, the index tables are first searched in step 71 until the identifier for the encoded symbol is found. The address of the stored encoded symbol is then found using the identifier, step 72; and, finally, the codeword is retrieved and decoded, step 83, using the decoder of, for example, FIG. 3, to provide the decompressed bitmap of the selected symbol or glyph.

An important aspect of the present invention is that a two-part code is used wherein the first part of the code, i.e., the model, is common for all the encoded glyphs; and the second part of the code, i.e., the codeword, comprises the encoded data representing a glyph. This simplifies indexing as for each glyph it is only necessary to locate the codeword. In the first embodiment described above, an arithmetic coder with a fixed probability table is used, which ensures near optimal compression of the glyphs, given the probability table, without the need for additional tables, as distinguished from Lempel-Ziv and Huffman coding schemes which perform poorly on short data blocks and require extensive code tables, respectively.

By the use of predictive coding, as provided in the second embodiment described above, with a fixed prediction table followed by a fixed Huffman code, it becomes possible to have a very fast decompression while retaining reasonable compression This method is particularly suitable for hardware implementation.

In general, in the present invention, by using an indexing method with a length table, and indexing tables in which are performed at least one search; each table is reduced to a list of identifiers. With the present invention, the total size of the addressing tables are only marginally larger than the space originally occupied by the identifiers; and, thus, we have gained the property of random access to the glyphs with only a slight increase in index table size.

It should be emphasized that the term "comprises/comprising" when used in this specification is taken to specify the presence of stated features, integers, steps or components, but does not preclude the presence or addition of one or more other features, integers, steps, components or groups thereof.

It should also be emphasized that while what has been described herein constitutes presently preferred embodiments of the invention, it should be recognized that the invention could take numerous other forms. Accordingly, it should be understood that the invention should be limited only insofar as is required by the scope of the following claims.

The invention claimed is:

1. A method for retrieving encoded data representing a symbol of a set of symbols which are stored in a memory, given an identifier for each symbol of the set of symbols, comprising the steps of:

providing an index table containing a list of identifiers for different symbols of the set of symbols;

sorting first by length and then by identifier, in ascending order, encoded data representing the symbols of the set of symbols, wherein the step of providing an index table includes providing an index table for each length, each index table containing a list of identifiers sorted in ascending order for symbols represented by encoded data of a particular length;

identifying a location at which the data representing the symbol of the set of symbols is stored in the memory using the identifier for the symbol, wherein the identifying step includes searching the index table to locate the identifier for the symbol;

if a location is identified, finding the address of the corresponding encoded data by summing the product of the length of the encoded data and the number of encoded data of that length over all encoded data lengths smaller than the one of the searched index table and adding the encoded data length of the searched table times the position of the identifier in the table; and retrieving the data representing the symbol from said memory.

2. The method according to claim 1, wherein said identifying step comprises searching the index tables for the identifier using a binary search.

3. The method according to claim 1, wherein said method further includes the step of decompressing the retrieved data.

4. The method according to claim 3, wherein said encoded data comprises a two-dimensional bitmap of a symbol.

5. Apparatus for retrieving data representing at least one symbol of a set of symbols which are stored in a memory, each of the at least one symbols having an identifier, the apparatus comprising:

a sorter adapted to sort and store in a memory, data representing the at least one symbol of the set of symbols by length;

an index table provided for each length, each index table containing a list of identifiers for symbols represented by data of a particular length;

a locator adapted to identify a location in the memory at which the data representing the at least one symbol of the set of symbols is stored using an identifier for the at least one symbol, the locator adapted to search an index table which contains a list of the identifiers for different symbols of the set of symbols;

the locator further adapted to find the address of the corresponding encoded data by summing the product of the length of the encoded data and the number of encoded data of that length over all encoded data lengths smaller than the one of the searched index table and adding the encoded data length of the searched table times the position of the identifier in the table; and a decoder which decodes the at least one symbol, wherein data representing each encoded symbol can be separately accessed and decoded.

* * * * *